(12) United States Patent
Yun et al.

(10) Patent No.: US 8,174,240 B2
(45) Date of Patent: May 8, 2012

(54) BATTERY MANAGEMENT SYSTEM USING A RESISTOR AND DRIVING METHOD THEREOF

(75) Inventors: Han-Seok Yun, Yongin-si (KR);
Soo-Seok Choi, Yongin-si (KR);
Young-Jo Lee, Yongin-si (KR);
Yong-Jun Tae, Yongin-si (KR);
Se-Wook Seo, Yongin-si (KR);
Gye-Jong Lim, Yongin-si (KR);
Beom-Gyu Kim, Yongin-si (KR);
Ho-Young Park, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 712 days.

(21) Appl. No.: 11/854,865

(22) Filed: Sep. 13, 2007

(65) Prior Publication Data
US 2008/0100298 A1 May 1, 2008

(30) Foreign Application Priority Data

Nov. 1, 2006 (KR) .......................... 10-2006-0107262

(51) Int. Cl.
*H02J 7/00* (2006.01)

(52) U.S. Cl. ........................................ 320/132; 320/107
(58) Field of Classification Search .................. 320/132, 320/DIG. 22; 324/430
See application file for complete search history.

(56) References Cited

U.S. PATENT DOCUMENTS

| 5,369,540 A | * | 11/1994 | Konrad et al. .................... 361/6 |
| 5,635,771 A | * | 6/1997 | Mertl et al. .................. 307/10.7 |
| 6,774,636 B2 | * | 8/2004 | Guiheen et al. ............... 324/429 |
| 2005/0269991 A1 | * | 12/2005 | Mitsui et al. .................. 320/132 |

FOREIGN PATENT DOCUMENTS

KR 2004-33278 4/2004

* cited by examiner

*Primary Examiner* — Arun Williams
(74) *Attorney, Agent, or Firm* — Christie, Parker & Hale, LLP

(57) ABSTRACT

A battery management system and a driving method include a first switch coupled to an end of a resistor. When calculating an internal resistance of a battery, the first switch is turned on and the battery and the resistor are coupled in parallel. Then, the internal resistance of the battery is calculated by using a second current flowing to the battery and a first current flowing to the resistor.

21 Claims, 3 Drawing Sheets

BATTERY MANAGEMENT SYSTEM USING A RESISTOR AND DRIVING METHOD THEREOF

CROSS-REFERENCE TO RELATED APPLICATION

This application claims priority to and the benefit of Korean Patent Application No. 2006-107262 filed in the Korean Intellectual Property Office on Nov. 01, 2006, the entire content of which is incorporated herein by reference.

BACKGROUND OF THE INVENTION

1. Field of the Invention

Aspects of the present invention relate to a battery management system (BMS). More particularly, aspects of the present invention relate to a BMS that can be used in a vehicle using electrical energy, and a driving method thereof.

2. Description of the Related Art

Vehicles that use internal combustion engines fueled by gasoline or heavy oil have caused serious air pollution. Accordingly, companies have made various efforts to develop electric and hybrid vehicles to reduce air pollution.

An electric vehicle uses a battery motor operating by electrical energy output from a battery. Since the electric vehicle is primarily driven by the battery, which is formed out of one battery pack including a plurality of rechargeable and dischargeable secondary cells, there is merit in that the electric vehicle does not emit emission gases and makes less noise.

The term "hybrid vehicle" commonly refers to a gasoline-electric hybrid vehicle that uses gasoline to power an internal-combustion engine and an electric battery to power an electric motor. Recently, companies have developed various types of hybrid vehicles, such as hybrid vehicles using an internal-combustion engine and fuel cells, and hybrid vehicles using a battery and fuel cells. The fuel cells directly obtain electrical energy by generating a chemical reaction while hydrogen and oxygen are continuously provided.

A vehicle driven by an electric motor uses secondary cells to power the vehicle, and since the secondary cells directly affect the performance of the vehicle using electrical energy, each secondary cell should have great performance. Also, a battery management system (BMS) should be provided in these hybrid vehicles to measure a voltage and a current of the overall battery to efficiently manage charging and discharging operations of each battery cell.

To manage the battery, the BMS should measure an internal resistance of the battery. However, when calculating the internal resistance of the battery by using an external resistor connected to a terminal of the battery, the external resistor may cause a power loss. Therefore, it is desirable to reduce power loss caused by the external resistor when the battery and the external resistor are coupled to calculate the internal resistance of the battery.

The above information disclosed in this Background section is only for enhancement of understanding of the background of the invention and therefore it may contain information that does not form the prior art that is already known in this country to a person of ordinary skill in the art.

SUMMARY OF THE INVENTION

Aspects of the present invention have been made in an effort to provide an improved battery management system to calculate an internal resistance of a battery by coupling the battery and an external resistor when calculating the internal resistance, and a driving method thereof.

According to an aspect of the invention, a battery management system includes a resistor, and a first switch coupled to an end of a resistor, wherein when calculating an internal resistance of a battery, the battery management system turns on the first switch to couple the battery with the resistor in parallel, and calculates the internal resistance of the battery by using a first current flowing to the resistor and a second current flowing to the battery. According to an aspect, the battery management system calculates the internal resistance of the battery by using the following equation:

$$R_b = \frac{R_f \times I_f}{I_c - I_f},$$

where $I_c$ denotes a charging and discharging current, $(I_c - I_f)$ denotes a second current value of the second current, Rf denotes a resistance of the resistor, If denotes a first current value of the first current, and Rb denotes the internal resistance of the battery.

According to an aspect, the battery management system further includes a second switch coupled between the battery and an inverter in series, which transmits the charging and discharging current to and from the battery, and a third switch coupled to the second switch in parallel, which is turned on when the battery is initially discharged or initially charged to prevent an initial in-rush current from flowing to and from the battery. According to an aspect, the resistor is a precharge resistor used to control a voltage between the battery and the inverter when the battery is initially charged or initially discharged.

According to another aspect of the invention, a battery management system includes a resistor coupled to the battery in parallel, a first current sensor to measure a current flowing to the resistor, a first switch having a first end coupled to the resistor and a second end coupled to a first voltage, and a main control unit (MCU) to turn the first switch on and to calculate an internal resistance of the battery by using a second current flowing to the battery and a first current flowing to the resistor.

According to an aspect, the battery management system further includes a second current sensor to measure a charging and discharging current, a second switch coupled between the battery and an inverter, having a first end coupled to the first current sensor and a second end coupled to the second current sensor, which transmits current to and from the battery to charge and discharge the battery, and a third switch coupled to the second end of the second switch in parallel and coupled to the first end of the resistor, which is turned on when the battery is initially discharged or initially charged to prevent an initial in-rush current from flowing from or to the battery. According to an aspect, the resistor is provided as a precharge resistor used to control a voltage between the battery and the inverter.

According to another aspect of the invention, a driving method to drive a battery management system that manages a battery includes selectively coupling a resistor to the battery in parallel, measuring a second current flowing to the battery, measuring a first current flowing to the resistor, and calculating an internal resistance of the battery by using the first current and the second current. According to an aspect, the selectively coupling of the resistor to the battery in parallel includes coupling the resistor to a first voltage. According to an aspect, the first voltage is a ground voltage. In addition, the calculation of the internal resistance of the battery includes calculating the internal resistance of the battery by using the following equation:

$$R_b = \frac{R_f \times I_f}{I_c - I_f},$$

where $I_c$ denotes a charging and discharging current, ($I_c$-If) denotes a second current value of the second current, Rf denotes a resistance of the resistor, If denotes a first current value of the first current, and Rb denotes the internal resistance of the battery. According to an aspect, the resistor is a precharge resistor used to control a voltage between the battery and an inverter.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
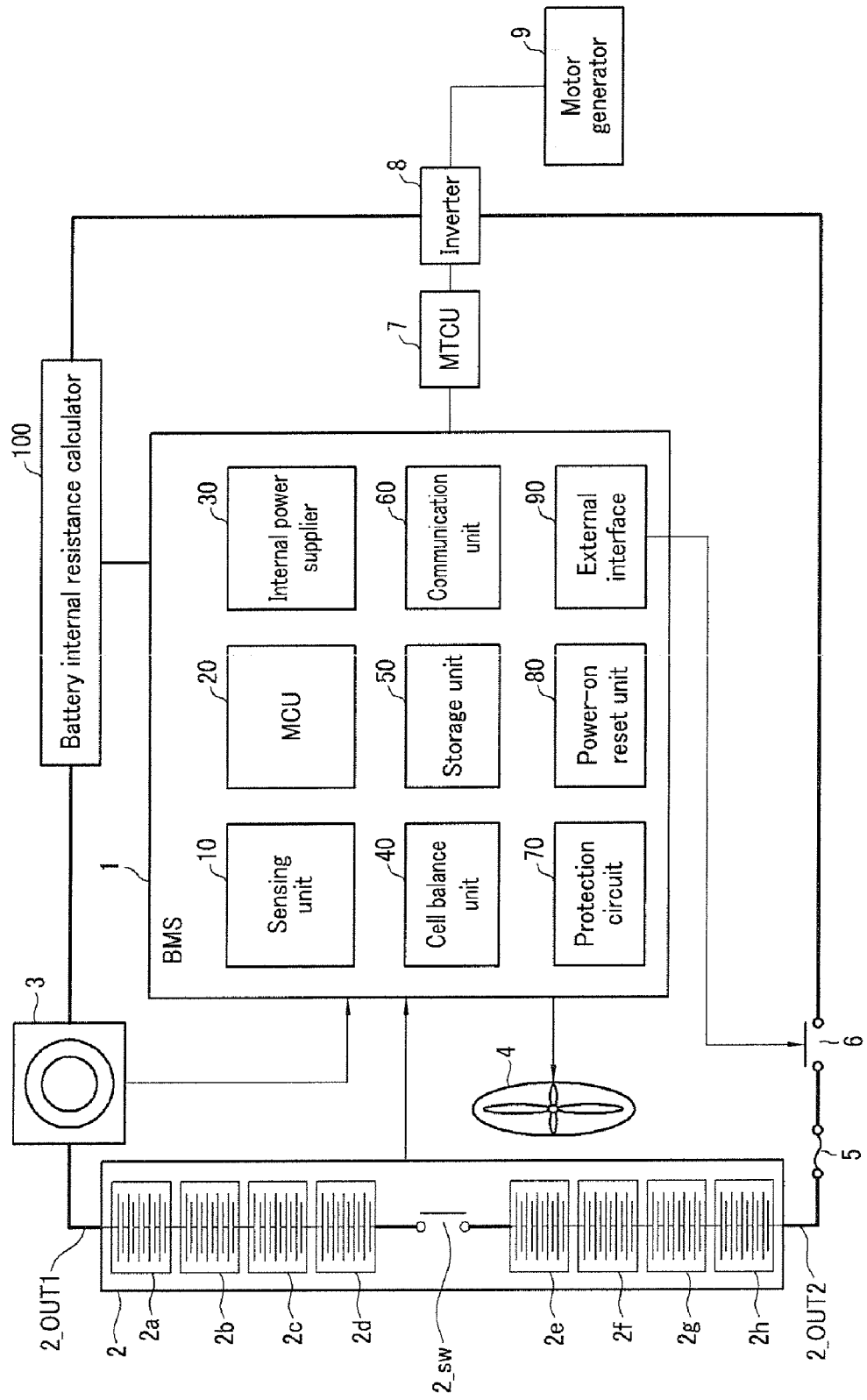
FIG. 1 shows a diagram representing a battery, a battery management system (BMS), and peripheral devices of the BMS which are used in a vehicle, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Throughout this specification and the claims that follow, when an element is described as "coupled" to another element, this description indicates that the element may be "directly coupled" to the other element or "electrically coupled" to the other element through a third or multiple elements. In addition, unless explicitly described to the contrary, the word "comprise" and variations such as "comprises" and "comprising" will be understood to imply the inclusion of stated elements but not the exclusion of any other elements.

FIG. 1 shows a diagram representing a battery, a battery management system (BMS) 1, and peripheral devices of the BMS 1 that may be used in a vehicle, according to an embodiment of the present invention. As shown in FIG. 1, the hybrid electric vehicle system includes a battery management system 1, a battery 2, a current sensor 3, a cooling fan 4, a fuse 5, a main switch 6, a motor control unit (MTCU) 7, an inverter 8, and a motor generator 9. It is understood that hybrid electric vehicle systems may have other components instead of or in addition to those components shown in FIG. 1 and described below.

The battery 2 includes a plurality of sub-packs 2a, 2b, 2c, 2d, 2e, 2f, 2g and 2h, each having a plurality of battery cells coupled in series to each other, output terminals 2_OUT1 and 2_OUT2, and a safety switch 2_SW provided between the sub-pack 2d and the sub-pack 2e. While eight sub-packs 2a, 2b, 2c, 2d, 2e, 2f, 2g and 2h are shown in FIG. 1 and one sub-pack is described as a plurality of battery cells in an embodiment of the present invention, the present invention is not limited thereto. The battery 2 may instead have more or less than eight sub-packs, and each sub-pack may only have one battery cell. The safety switch 2_SW is manually turned on and off to guarantee safety for a worker when performing operations for the battery or replacing the battery. In an embodiment of the present invention, the safety switch 2_SW is disposed between the sub-pack 2d and the sub-pack 2e, but the safety switch 2 SW is not limited thereto and may instead be disposed between different sub-packs. The output terminals 2_OUT1 and 2_OUT2 are coupled to the inverter 8.

The current sensor 3 measures an output current value of the battery 2 and outputs the measured output current value to the sensing unit 10 of the BMS 1. The current sensor 3 may be embodied as various types, including as a hall current transformer (Hall CT) using a hall element to measure a current value and to output an analog current signal corresponding to the measured current value, or a shunt resistor to output a voltage signal corresponding to a current value through a resistor inserted on a load line. It is understood that many different types of current sensors may be used to measure the output current value of the battery 2, and the current sensor 3 is not limited to being a Hall CT or a shunt resistor.

The cooling fan 4 cools down heat generated by charging and discharging the battery 2 in response to a control signal of the BMS 1. Additionally, the cooling fan 4 prevents the battery 2 from deteriorating due to a temperature increase and prevents inefficient charging and discharging of the battery.

The fuse 5 prevents an overflowing current, which may be caused by various malfunctions, such as a disconnection or a short circuit of the battery 2, from being transmitted to the battery 2. That is, when an over-current is generated, the fuse 5 is disconnected so as to interrupt the current from overflowing.

The main switch 6 turns the battery on and off in response to the control signal of the BMS 1 or a control signal of the MTCU when an unusual phenomenon, including an overflowed voltage, an over-current, or a high temperature, occurs.

The BMS 1 includes a sensing unit 10, a main control unit (MCU) 20, an internal power supplier 30, a cell balance unit 40, a storage unit 50, a communication unit 60, a protection circuit unit 70, a power-on reset unit 80, and an external interface 90. It is understood that the BMS 1 may have other components instead of or in addition to those shown in FIG. 1 and described below, and that the components shown in FIG. 1 may be arranged in a different configuration, for example, the sensing unit 10 and the internal power supplier 30 may be switched.

The sensing unit 10 measures a battery voltage V, a battery current i, and a battery temperature T, and transmits the measured values to the MCU 20.

A battery internal resistance calculator 100 includes a first current sensor 110, a second current sensor 120, a resistor Rf, a first switch S1, a second switch S2, and a third switch S3. It is understood that the battery internal resistance calculator 100 may have other components instead of or in addition to those shown in FIG. 2 and described below.

The MCU 20 estimates a state of charge (SOC) and a state of health (SOH) of the battery 2 based on the battery voltage V, the battery current i, and the battery temperature T, and controls charging and discharging of the battery 2. In addition, the MCU 20 controls the battery internal resistance calculator 100 by transmitting a control signal thereto, and calculates an internal resistance of the battery during charging and discharging. More specifically, the MCU 20 connects a resistor Rf (FIG. 2) to the battery 2 in parallel, and measures a current value flowing through the battery 2 and the resistor Rf. In addition, the MCU 20 calculates an internal resistance value by using the current value flowing through the battery 2 and the resistor Rf.

The internal power supply unit 30, also known as a power source, supplies power to the BMS 1 from a backup battery. The cell balance unit 40 balances the state of charge of each cell. That is, cells sufficiently charged are discharged, and cells relatively less charged are further charged. The storage unit 50 stores data of the current SOC and SOH when the power source of the BMS 1 is turned off. Here, an electrically erasable programmable read-only memory (EEPROM) may be used for the storage unit 50. However, it is understood that other types of memories, such as flash drives or other types of non-volatile storage memories, may be used instead of an EEPROM.

The communication unit 60 communicates with the MTCU 7 of the vehicle. Specifically, the communication unit 60 transmits SOC information and SOH information from the BMS 1 to the MTCU 7, or transmits vehicle operation state information received from the MTCU 7 to the MCU 20. The communication unit 60 may include electrical wires to communicate with the MTCU by electrical current.

The protection circuit unit 70 is a secondary circuit provided to protect the battery 2 from shocks, over-flowed currents, and low voltages by using hardware elements. An internal element of the MCU 20 is the primary protection for the battery 2. The internal element of the MCU 20 is preferably, but not necessarily, embodied as firmware. The power-on reset unit 80 resets the overall system when the power source of the BMS 1 is turned on. The external interface 90 couples auxiliary devices for the BMS 1, such as the cooling fan 4 and main switch 6, to the MCU 20. It is understood that while the cooling fan 4 and the main switch 6 are shown as the only BMS 1 auxiliary devices in an embodiment of the present invention, the present invention is not limited thereto, and may include various other types of auxiliary devices, such as other temperature regulating devices, other switches and fuses, and other sensors. Furthermore, the cooling fan 4 and main switch 6 are not required to be included in all aspects of the invention.

The MTCU 7 checks a current operation state of the vehicle based on information about an accelerator pedal, a brake pedal, and a vehicle speed, and determines a required torque state. According to an aspect of the invention, the current operation state of the vehicle indicates factors including whether the engine is turned on or off, and whether the vehicle is moving at a constant velocity or is accelerating. The MTCU 7 transmits this vehicle state information to the communication unit 60 of the BMS 1. The MTCU 7 controls an output of the motor-generator 9 corresponding to the torque information. That is, the MTCU 7 controls a switching operation of the inverter 8 and controls the output of the motor generator 9 so that the output corresponds to the torque information. In addition, the MTCU 7 receives the SOC of the battery 2 from the MCU 20 through the communication unit 60, and controls the SOC level of the battery 2 to maintain a target level, e.g., 55%.

For example, when the SOC level transmitted from the MCU 20 is lower than a target level, such as, for example, 55%, the MTCU 7 switches a switch on the inverter 8 so as to output power toward the battery 2 and thereby charge the battery 2. In this case, the battery pack current I is a negative value (−). When the SOC level is greater than 55%, the MTCU 7 controls the switch on the inverter 8 to output the power toward the motor generator 9 and discharge the battery 2. In this case, the battery pack current I is a positive value (+).

The inverter 8 controls the battery 2 to be charged or discharged in response to the control signal of the MTCU 7.

The motor generator 9 converts the electrical energy of the battery into mechanical energy to drive the vehicle based on the torque information transmitted from the MTCU 7, and converts the mechanical energy of the vehicle into electrical energy to charge the battery 2. The motor generator 9 may be any type commonly used with hybrid vehicles.

Accordingly, since the MTCU 7 charges and discharges the battery 2 based on the SOC level to prevent the battery 2 from being overcharged or over-discharged, the battery 2 may be efficiently used for a long time. However, since it is difficult to measure an actual SOC level of the battery 2 when the battery 2 is mounted on the vehicle, the BMS 1 should precisely estimate the SOC level by using the battery voltage, battery current, and battery temperature sensed by the sensing unit 10 and then transmit this precisely estimated SOC to the MTCU 7.

A method for calculating an internal resistance of the battery according to an embodiment of the present invention will be described in further detail with reference to FIG. 2 and FIG. 3.

Figure 2:
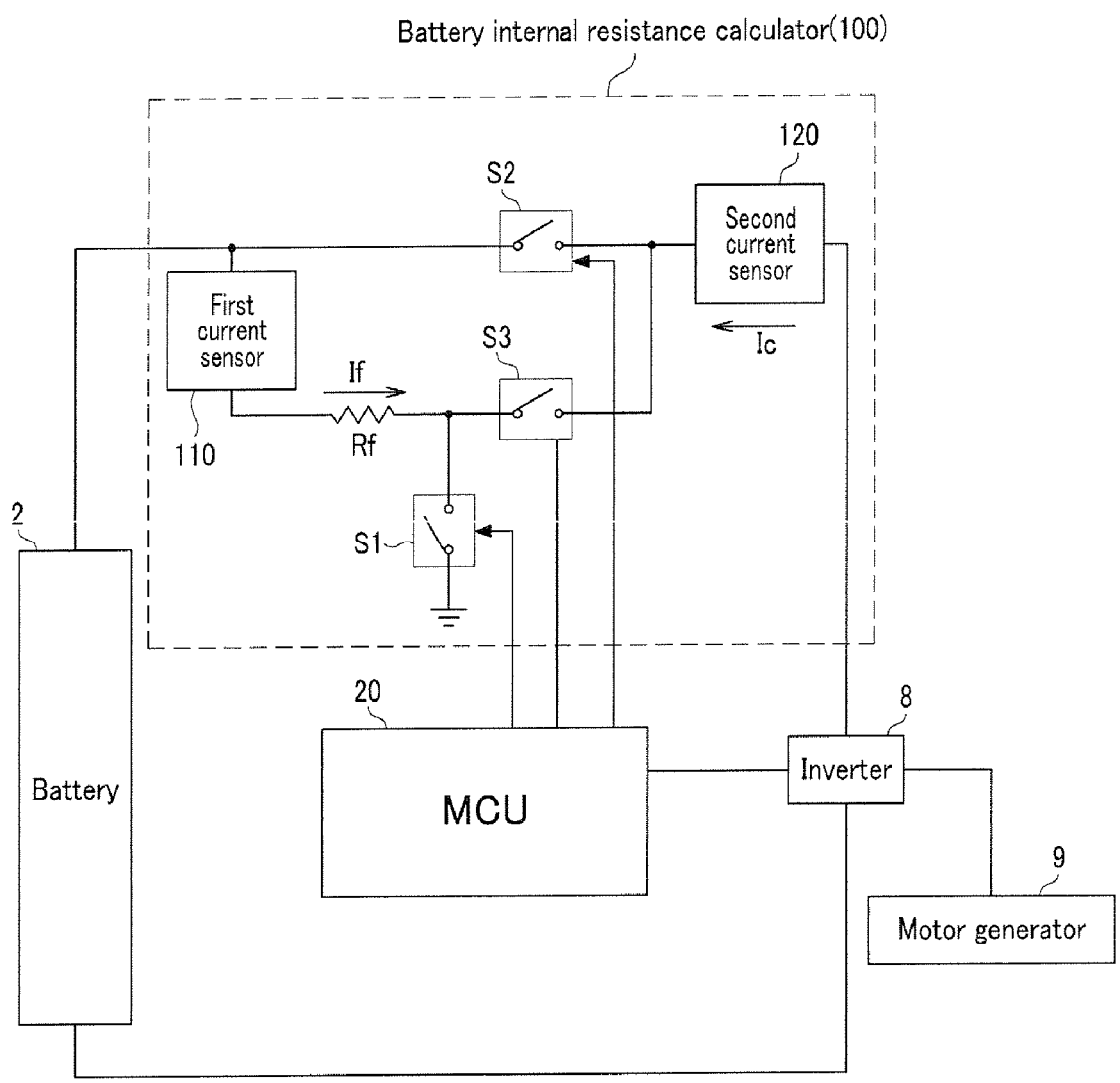
FIG. 2 schematically shows the main control unit (MCU) and the battery internal resistance calculator shown in FIG. 1.

FIG. 2 schematically shows the MCU 20 and the battery internal resistance calculator 100 according to an embodiment of the present invention. As shown in FIG. 2, the MCU 20 controls switches S1, S2, and S3 of the battery internal resistance calculator 100 by transmitting first, second, and third control signals thereto. In further detail, the MCU 20 generates the first control signal to control the first switch S1 when calculating an internal resistance of the battery 2. In addition, the MCU 20 generates the second control signal to control the second switch S2 when the battery 2 is charged or discharged, and generates the third control signal to control the third switch when the battery 2 is initially charged or initially discharged. The third switch S3 is used to prevent an initial in-rush current from flowing due to a voltage difference between the battery 2 and the inverter 8 which is generated when the battery is initially discharged or initially charged. The control signals according to an embodiment of the present invention have predetermined voltage levels corresponding to each of the first, second and third switches S1, S2 and S3, and turn the three switches on and off based on these predetermined voltage levels.

The battery internal resistance calculator 100 is preferably, but not necessarily, disposed between the battery 2 and the inverter 8, and includes the first current sensor 110, the second current sensor 120, the resistor Rf, the first switch S1, the second switch S2, and the third switch S3. More specifically, the second switch S2 couples the battery 2 and the inverter 8 when the battery 2 is charged and discharged. In addition, the second current sensor 120 is serially coupled to the inverter 8, and measures a value of the current Ic flowing from and to the inverter 8 when the battery 2 is charged and discharged. This current Ic is known as a charging/discharging current. A first end of the first current sensor 110 is coupled to a second end of the second switch S2 in parallel, and a second end of the first current sensor 110 is coupled to the resistor Rf in series. The first current sensor 110 measures a value of the first current If flowing to the resistor Rf. By measuring the first current If and the charging/discharging current Ic, the second current (Ic–If) flowing to the battery 2 can be calculated. The first and second current sensors 110 and 120, respectively, may be embodied as various types, including as Hall CTs or shunt resistors.

In addition, a first end of the first switch S1 is coupled to the resistor Rf, and a second end of the first switch S1 is coupled to a ground voltage. A first end of the third switch S3 is coupled to the resistor Rf, and a second end of the third switch S3 is coupled to the second switch S2 in parallel. Preferably, the resistor Rf is a precharge resistor, and prevents the initial in-rush current from flowing due to the voltage difference between the battery 2 and the inverter 8 when the battery 2 is initially charged or initially discharged. The initial in-rush current is a current generated due to a voltage difference between the battery and a capacitor (not shown) coupled to the inverter 8. The BMS 1 according to an embodiment of the present invention turns on the first switch S1 to couple the battery 2 and the resistor Rf only when calculating an internal resistance of the battery 2, so that power consumption caused by the resistor Rf when the internal resistance is not being calculated can be prevented.

A battery internal resistance calculation method using a control signal generated by the MCU 20 will be described in more detail hereinafter. The MCU 20 calculates a battery internal resistance when the battery 2 is charged or discharged. Particularly, the MCU 20 transmits the first control signal to the battery internal resistance calculator 100 and turns on the first switch S1 when calculating the internal resistance of the battery 2. Then, the battery 2 and the resistor Rf are coupled in parallel. At this point, the second switch S2 is in the turn-on state, and the third switch S3 is in the turn-off state. In addition, the MCU 20 measures a value of a second current (Ic–If) flowing to the battery 2 and a value of a first current If flowing to the resistor Rf from the current Ic flowing to the second switch S2 in the turn-on state.

Then, the MCU 20 divides a product of the resistance value of the resistor Rf and the value of the first current If by the value of the second current (Ic–If) to calculate the internal resistance value of the battery 2. When the first switch 81 is turned on, the battery 2 and the resistor Rf are coupled in parallel, and accordingly, a voltage generated at lateral ends of the battery 2 becomes equal to a voltage generated at lateral ends of the resistor Rf and the internal resistance of the battery 2 can be calculated by using the equivalent voltage. In this case, the battery internal resistance can be calculated as given in Equation 1.

$$R_b = \frac{R_f \times I_f}{I_c - I_f} \quad \text{[Equation 1]}$$

where $I_c$ denotes a charging and discharging current, (Ic–If) denotes the second current value of the second current, Rf denotes the resistance of the resistor, If denotes the first current value of the first current, and Rb denotes the internal resistance of the battery 2.

Figure 3:
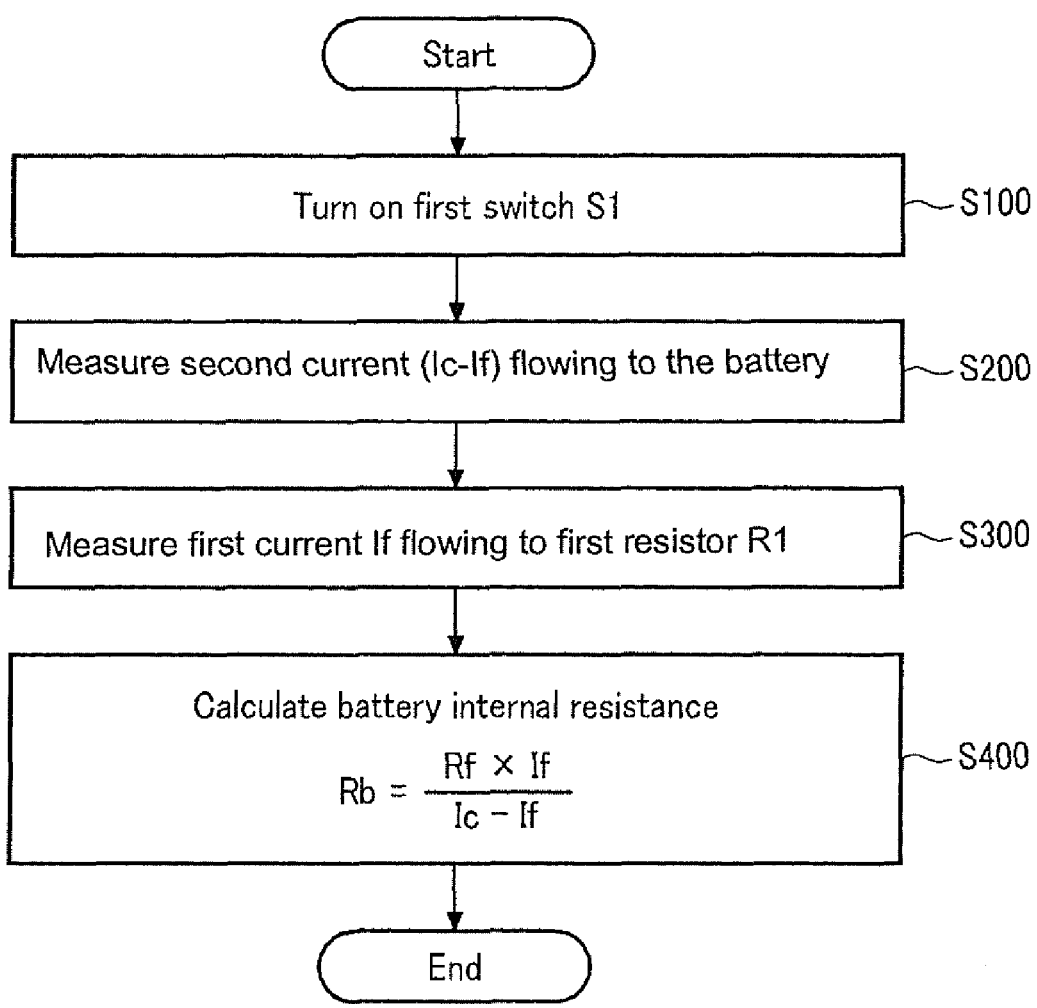
FIG. 3 is a flowchart of a battery internal resistance calculation method according to an embodiment of the present invention.

FIG. 3 is a flowchart of a process to calculate an internal resistance of the battery 2 according to an embodiment of the present invention. When the battery 2 is charged or discharged, the MCU 20 turns on the first switch S1 by transmitting the first control signal to the battery internal resistance calculator 100 in operation S100. When the first switch S1 is turned on, the MCU 20 measures the second current (Ic–If) flowing to the battery 2 in operation S200, and measures the first current If flowing to the resistor Rf in operation S300. Then, the MCU 20 divides a product of the resistor Rf and the first current If by the second current (Ic–If) to calculate the internal resistance of the battery 2 by using Equation 2, in operation S400.

As described above, when calculating the internal resistance of the battery 2, the first switch S1 is turned on to measure the first current If, and the internal resistance of the battery 2 can be calculated by using the second current (Ic–If) flowing to the battery 2 and the first current If flowing to the resistor Rf.

Accordingly, when calculating the internal resistance of the battery 2, the battery 2 and the external resistor Rf are coupled to each other to calculate the internal resistance of the battery 2. Thus, using the battery management system and the driving method of the battery management system according to embodiments of the present invention reduces unnecessary power consumption caused by an external resistor being coupled to a battery when not calculating an internal resistance of the battery.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A battery management system comprising:
   a resistor configured to be coupled in series
      between a battery and a first power source, and
      between an external source and the first power source; and
   a first switch coupled between one end of the resistor and the first power source,
   wherein the battery management system is configured to calculate an internal resistance of the battery while charging the battery from the external source and while discharging the battery to the external source by:
      turning on the first switch to couple the resistor in series
         between the battery and the first power source when discharging the battery to the external source, and
         between the external source and the first power source when charging the battery from the external source; and
      calculating the internal resistance of the battery by using a value of a first current flowing to the resistor and a value of a second current flowing to/from the battery.

2. The battery management system of claim 1, wherein the battery management system is further configured to calculate the internal resistance of the battery by using the following equation:

$$R_b = \frac{R_f \times I_f}{I_c - I_f},$$

where Ic denotes a charging and discharging current of the external source, If denotes the first current value, (Ic–If) denotes the second current value, Rf denotes a resistance of the resistor, and Rb denotes the internal resistance of the battery.

3. The battery management system of claim 2, further comprising:

a second switch coupled between the battery and an inverter in series, the second switch for transmitting the charging and discharging current between the battery and the external source; and a third switch coupled to the second switch in parallel, the third switch for turning on when the battery is initially discharged or initially charged to prevent an initial in-rush current from flowing between the battery and the external source.

4. The battery management system of claim 3, wherein the resistor is a precharge resistor used to control a voltage between the battery and the inverter when the battery is initially charged or initially discharged.

5. The battery management system of claim 2, wherein the resistor is a precharge resistor used to control a voltage between the battery and an inverter when the battery is initially charged or initially discharged.

6. The battery management system of claim 1, wherein the resistor is a precharge resistor used to control a voltage between the battery and an inverter when the battery is initially charged or initially discharged.

7. The battery management system of claim 1, wherein the battery is for use in an electric or hybrid vehicle.

8. A battery management system to manage a battery, the battery management system comprising:
  a resistor configured to be coupled in series
    between the battery and a first power source; and
    between an external source and the first power source;
  a first current sensor to measure a first current flowing to the resistor;
  a first switch having a first end coupled to the resistor and a second end coupled to the first power source having a first voltage; and
  a main control unit (MCU) to:
    turn on the first switch to couple the resistor in series
      between the battery and the first power source when discharging the battery to the external source, and
      between the external source and the first power source when charging the battery from the external source; and
    calculate an internal resistance of the battery while charging the battery from the external source and while discharging the battery to the external source by using a value of a second current flowing to/from the battery and a value of the first current flowing to the resistor.

9. The battery management system of claim 8, further comprising:
  a second current sensor to measure a charging and discharging current of the external source;
  a second switch coupled between the battery and an inverter in series, the second switch having a first end coupled to the first current sensor and a second end coupled to the second current sensor, the second switch for transmitting the charging and discharging current between the battery and the external source to charge and discharge the battery; and
  a third switch coupled to the second end of the second switch in parallel and coupled to a first end of the resistor, the third switch for turning on when the battery is initially discharged or initially charged to prevent an initial in-rush current from flowing between the battery and the external source.

10. The battery management system of claim 9, wherein the resistor is a precharge resistor used to control a voltage between the battery and the inverter.

11. The battery management system of claim 8, wherein the resistor is a precharge resistor used to control a voltage between the battery and an inverter.

12. The battery management system of claim 8, wherein the battery is for use in an electric or hybrid vehicle.

13. A driving method to drive a battery management system that manages a battery, the driving method comprising:
  selectively coupling a resistor in series
    between the battery and a first power source, and
    between an external source and the first power source by using a first switch coupled between one end of the resistor and the first power source;
  measuring a second current flowing to/from the battery
    while charging the battery from the external source and
    while discharging the battery to the external source;
  measuring a first current flowing to the resistor
    while charging the battery from the external source when the resistor is selectively coupled in series between the external source and the first power source, and
    while discharging the battery to the external source when the resistor is selectively coupled in series between the battery and the first power source; and
  calculating an internal resistance of the battery by using a value of the first current and a value of the second current.

14. The driving method of claim 13, wherein the selectively coupling of the resistor comprises selectively coupling the one end of the resistor with the first power source having a first voltage during the measuring of the first current.

15. The driving method of claim 14, wherein the first voltage is a ground voltage.

16. The driving method of claim 14, wherein the calculating of the internal resistance comprises calculating the internal resistance of the battery by using the following equation:

$$R_b = \frac{R_f \times I_f}{I_c - I_f},$$

where Ic denotes a charging and discharging current of the external source, If denotes the first current value, (Ic−If) denotes the second current value, Rf denotes a resistance of the resistor, and Rb denotes the internal resistance of the battery.

17. The driving method of claim 16, wherein the resistor is a precharge resistor used to control a voltage between the battery and an inverter.

18. A battery management system to manage a battery, comprising:
  a resistor configured to be selectively coupled in series
    between the battery and a first power source, and
    between an external source and the first power source; a switch coupled between one end of the resistor and the first power source; and
  a main control unit for measuring an internal resistance of the battery by selectively coupling the resistor in series
    between the battery and the first power source when discharging the battery to the external source, and
    between the external source and the first power source when charging the battery from the external source, by selectively turning on the switch.

19. The battery management system of claim 18, wherein the main control unit is configured to measure the internal resistance of the battery by using the following equation:

$$R_b = \frac{R_f \times I_f}{I_c - I_f},$$

where Ic denotes a charging and discharging current of the external source, If denotes a value of a first current flowing to the resistor, (Ic−If) denotes a value of a second current flowing to/from the battery, Rf denotes a resistance of the resistor, and Rb denotes the internal resistance of the battery.

20. A driving method to drive a battery management system that manages a battery, the driving method comprising:
  selectively coupling a resistor in series
    between the battery and a first power source, and
    between an external source and the first power source, by using a switch coupled between one end of the resistor and the first power source; and
  calculating an internal resistance of the battery,
  wherein when measuring the internal resistance of the battery, the resistor is selectively coupled in series
    between the battery and a first power source when discharging the battery to the external source, and
    between the external source and the first power source when charging the battery from the external source, by selectively turning on the switch.

21. The driving method of claim 20, wherein the calculating of the internal resistance of the battery comprises using the equation:

$$R_b = \frac{R_f \times I_f}{I_c - I_f},$$

where Ic denotes a charging and discharging current of the external source, If denotes a value of a first current flowing to the resistor, (Ic−If) denotes a value of a second current flowing to/from the battery, Rf denotes a resistance of the resistor, and Rb denotes the internal resistance of the battery.

* * * * *